United States Patent
Aoki et al.

(10) Patent No.: US 10,369,607 B2
(45) Date of Patent: Aug. 6, 2019

(54) SAFETY DEVICE OF PRESS BRAKE AND CONTROLLING METHOD OF PRESS BRAKE

(71) Applicant: AMADA HOLDINGS CO., LTD., Kanagawa (JP)

(72) Inventors: Takayuki Aoki, Kanagawa (JP); Kento Matsuura, Kanagawa (JP); Ryota Okamoto, Kanagawa (JP)

(73) Assignee: AMADA HOLDINGS CO., LTD., Kanagawa (JP)

( * ) Notice: Subject to any disclaimer, the term of this patent is extended or adjusted under 35 U.S.C. 154(b) by 0 days.

(21) Appl. No.: 16/093,026

(22) PCT Filed: Mar. 14, 2017

(86) PCT No.: PCT/JP2017/010085
§ 371 (c)(1),
(2) Date: Oct. 11, 2018

(87) PCT Pub. No.: WO2017/179355
PCT Pub. Date: Oct. 19, 2017

(65) Prior Publication Data
US 2019/0151921 A1   May 23, 2019

(30) Foreign Application Priority Data

Apr. 14, 2016 (JP) ................................. 2016-080757

(51) Int. Cl.
*D21D 5/02* (2006.01)
*B21D 5/02* (2006.01)
(Continued)

(52) U.S. Cl.
CPC .............. *B21D 5/02* (2013.01); *B21C 51/00* (2013.01); *B21D 55/00* (2013.01); *B30B 15/166* (2013.01);
(Continued)

(58) Field of Classification Search
CPC ........ B21D 5/02; B21D 55/00; B30B 15/285; F16P 3/144; H01L 27/146
(Continued)

(56) References Cited

U.S. PATENT DOCUMENTS 4,166,369 A * 9/1979 Nakajima ............... F16P 3/144
72/21.1
4,660,703 A * 4/1987 Filcich .................... F16P 3/144
192/129 A (Continued)

FOREIGN PATENT DOCUMENTS

EP   1 387 121   2/2004
EP   1 515 078   4/2007
(Continued)

OTHER PUBLICATIONS

Notification of Reasons for Refusal issued in Japan Counterpart Patent Appl. No. 20016-080757, dated May 30, 2017 , along with an english translation thereof.
(Continued)

*Primary Examiner* — David B Jones
(74) *Attorney, Agent, or Firm* — Greenblum & Bernstein, P.L.C.

(57) ABSTRACT

A projector emits laser light, and an optical receiver includes a photodetector. When an upper table is lowered, a safety controller controls lowering of the upper table to stop, when it is determined that the optical receiver is in a light obstructing state in a period in which a condition is satisfied that a first distance between a tip of a punch and an upper end of a material is equal to or greater than a second distance between the tip of the punch and the photodetector, and controls the lowering to continue without stopping the lowering of the upper table even when it is determined that the optical receiver is in the light obstructing state in a period
(Continued)

in which a condition is satisfied that the first distance is less than the second distance.

4 Claims, 9 Drawing Sheets

(51) Int. Cl.
    *B30B 15/16*     (2006.01)
    *B30B 15/18*     (2006.01)
    *B21C 51/00*     (2006.01)
    *H01L 27/146*     (2006.01)
    *B21D 55/00*     (2006.01)
    *F16P 3/14*     (2006.01)

(52) U.S. Cl.
    CPC .............. *B30B 15/18* (2013.01); *F16P 3/144* (2013.01); *H01L 27/146* (2013.01)

(58) Field of Classification Search
    USPC ............................................................ 72/19
    See application file for complete search history.

(56) References Cited

U.S. PATENT DOCUMENTS

| | | | | |
|---|---|---|---|---|
| 5,579,884 A * | 12/1996 | Appleyard | ............... | F16P 3/144 192/129 A |
| 6,316,763 B1 * | 11/2001 | Appleyard | ............... | B21D 5/02 100/342 |
| 6,660,993 B2 * | 12/2003 | Appleyard | ............... | B21D 5/02 100/342 |
| 6,677,574 B2 * | 1/2004 | Fiessler | ................ | B30B 15/285 250/221 |
| 6,752,253 B2 * | 6/2004 | Fiessler | ................ | B21D 55/00 192/129 A |
| 7,034,929 B2 * | 4/2006 | Bergbach | ................ | F16P 3/144 100/348 |
| 7,080,534 B2 * | 7/2006 | Schneiderheinze | ..... | F16P 3/144 100/342 |
| 7,286,895 B2 * | 10/2007 | Krieg | ..................... | B21D 55/00 100/348 |
| 7,448,242 B2 * | 11/2008 | Dieterle | ................... | B21D 5/02 100/248 |
| 7,454,935 B2 * | 11/2008 | Braune | .................... | G01V 8/20 100/348 |
| 7,963,137 B2 * | 6/2011 | Braune | ................. | B30B 15/285 100/341 |
| 9,346,091 B2 * | 5/2016 | Hufnagel | ................. | B21D 5/02 |
| 2005/0247102 A1 | 11/2005 | Schneider Heinze | | |
| 2015/0314364 A1 | 11/2015 | Fiessler | | |

FOREIGN PATENT DOCUMENTS

| | | |
|---|---|---|
| JP | 2005-296966 | 10/2005 |
| JP | 2006-504914 | 2/2006 |
| JP | 2015-211984 | 11/2015 |

OTHER PUBLICATIONS

International Search Report issued in International Bureau of WIPO Patent Application No. PCT/JP2017/010085, dated Jun. 13, 2017, along with an english translation thereof.

Decision to Grant a Patent in JP Application No. 2016-080757, dated Oct. 12, 2017 and English translation thereof.

Written Opinion of International Searching Authority in PCT/JP2017/010085 dated Jun. 13, 2017, along with an english translation thereof.

\* cited by examiner

| BENDING CONDITION | STOP/ NON-STOP | PHOTODIODES Pd1~Pd3 | PHOTODIODES Pd4~Pd6 |
|---|---|---|---|
| NORMAL BENDING | STOP CONDITION | H≧hi | H≧hi |
| | NON-STOP CONDITION | H<hi | H<hi |
| BOX BENDING | STOP CONDITION | H≧hi | Hf≧hi |
| | NON-STOP CONDITION | H<hi | Hf<hi |

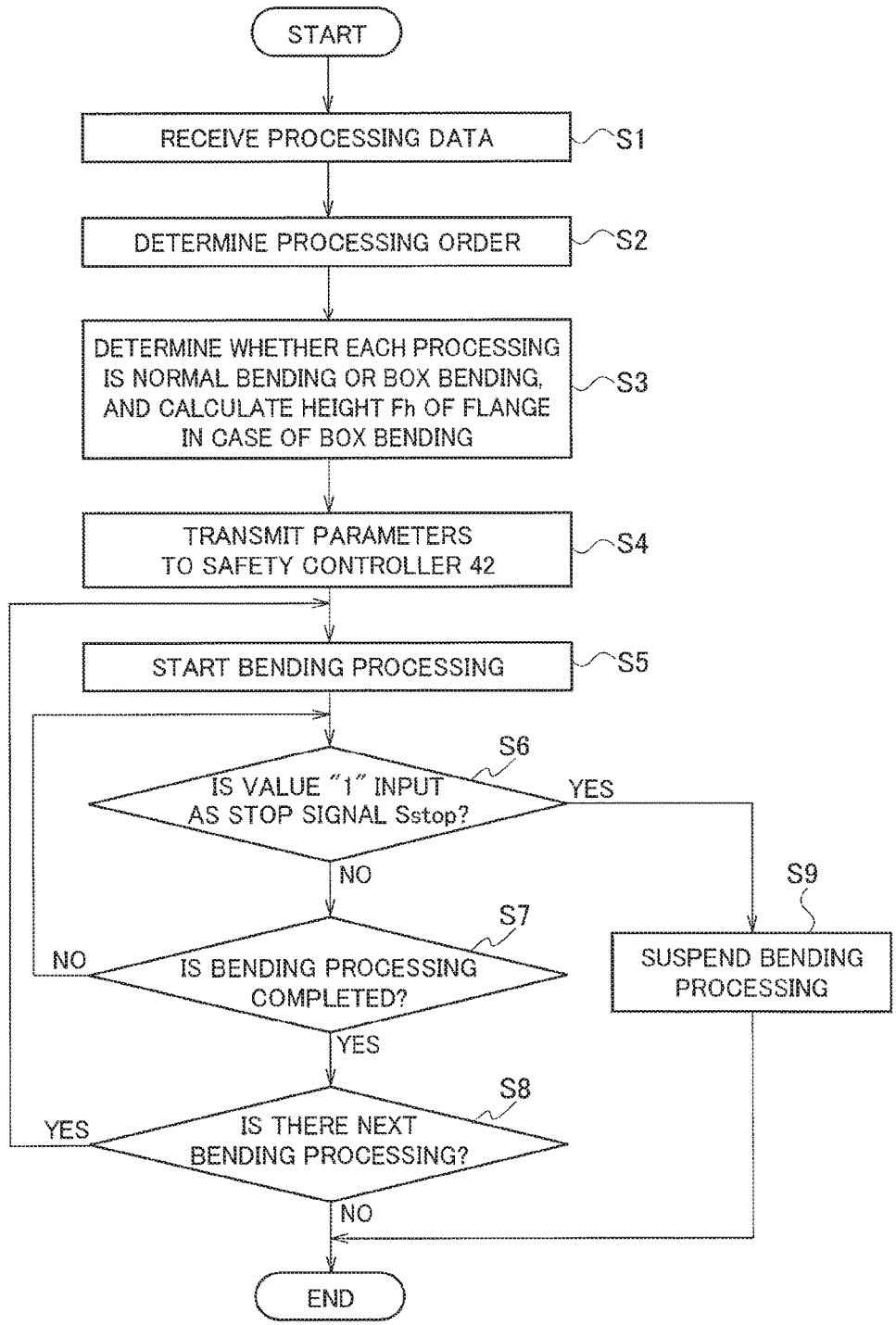

SAFETY DEVICE OF PRESS BRAKE AND CONTROLLING METHOD OF PRESS BRAKE

TECHNICAL FIELD

The present disclosure relates to a safety device of a press brake and a controlling method of a press brake.

BACKGROUND ART

A press brake includes an upper table mounted with a punch and a lower table mounted with a die. The press brake lowers the upper table to the lower table, and bends a metal material in the state of being sandwiched between the punch and the die. In order to prevent that the hand of a person enters the area where the punch is lowered when the material is bent, the press brake includes a safety device which detects that an intrusion object such as the hand of a person enters the area and stops the operation of a bending processing.

As one of the safety devices, a so-called laser type of the safety device is provided which stops the operation of the bending processing when an intrusion object obstructs laser light. In this type of safety device, it is necessary not to stop the operation of the bending processing in a case where the laser light is obstructed by the bent material. Patent Literature 1 and 2 describes that a safety interval is set such that a finger does not enter the upper side of the material, and the safety device is invalidated after the punch reaches the area which is set in the safety interval above the material.

CITATION LIST

Patent Literature

[Patent Literature 1]: European Patent No. 1387121
[Patent Literature 2]: European Patent No. 1515078

SUMMARY OF THE INVENTION

Patent Literature 1 describes that the safety interval is 6 to 14 mm. However, it is not preferable that the safety device is invalidated even in such a relatively short distance.

An object of an embodiment is to provide a safety device of a press brake and a controlling method of a press brake which can allow an operation of a bending processing not to stop in a case where laser light is obstructed by a material, and can allow the operation of the bending processing to stop in a case where the laser light is obstructed by an intrusion object without setting an area where the safety device is invalidated above the material.

A first aspect of an embodiment provides a safety device of a press brake which includes an upper table for holding a punch, a lower table for holding a die, and an actuator which lowers and raises the upper table, the safety device including: a projector which is mounted on the upper table, and configured to emit laser light in such a way that the laser light passes through between the punch and the die; an optical receiver which is mounted on the upper table, comprising a photodetector which detects the laser light passing through between the punch and the die, and configured to determine whether the optical receiver is in a light receiving state of receiving the laser light, or in a light obstructing state of not receiving the laser light; and a safety controller configured, when the actuator lowers the upper table for performing a bending processing by sandwiching a material arranged on the die between the punch and the die to control lowering of the upper table to stop when it is determined that the optical receiver is in the light obstructing state in a period in which a condition is satisfied that a first distance between a tip on the die side of the punch and an upper end of the punch side of the material is equal to or greater than a second distance between the tip of the punch and the photodetector, and to control the lowering to continue without stopping the lowering of the upper table even when it is determined that the optical receiver is in the light obstructing state in a period in which a condition is satisfied that the first distance is less than the second distance.

A second aspect of an embodiment provides a controlling method of a press brake, including: emitting laser light by a projector mounted on an upper table in such a way that the laser light passes through between a punch held by the upper table and a die held by a lower table; determining whether an optical receiver mounted on the upper table is in a light receiving state of receiving the laser light or in a light obstructing state of not receiving the light, based on whether a photodetector provided in the optical receiver detects the laser light passing through between the punch and the die; controlling, when an actuator which lowers and raises the upper table lowers the upper table for performing a bending processing by sandwiching a material arranged on the die between the punch and the die, the actuator to stop lowering of the upper table, when it is determined that the optical receiver is in the light obstructing state in a period in which a condition is satisfied that a first distance between a tip on the die side of the punch and an upper end of the punch side of the material is equal to or greater than a second distance between the tip of the punch and the photodetector; and controlling, when the actuator lowers the upper table for performing the bending processing by sandwiching the material arranged on the die between the punch and the die, the actuator to continue the lowering without stopping the lowering of the upper table even when it is determined that the optical receiver is in the light obstructing state in a period in which a condition is satisfied that the first distance is less than the second distance.

In accordance with the safety device of the press brake and the controlling method of the press brake according to an embodiment, it is possible to allow the operation of the bending processing not to stop in a case where laser light is obstructed by a material, and to allow the operation of the bending processing to stop in a case where the laser light is obstructed by an intrusion object without setting an area where the safety device is invalidated above the material.

BRIEF DESCRIPTION OF THE DRAWINGS

FIG. 10 is a flowchart illustrating a process in which a press brake control device controls the press brake to execute the bending processing of the material.

MODES FOR CARRYING OUT THE INVENTION

Figure 1:
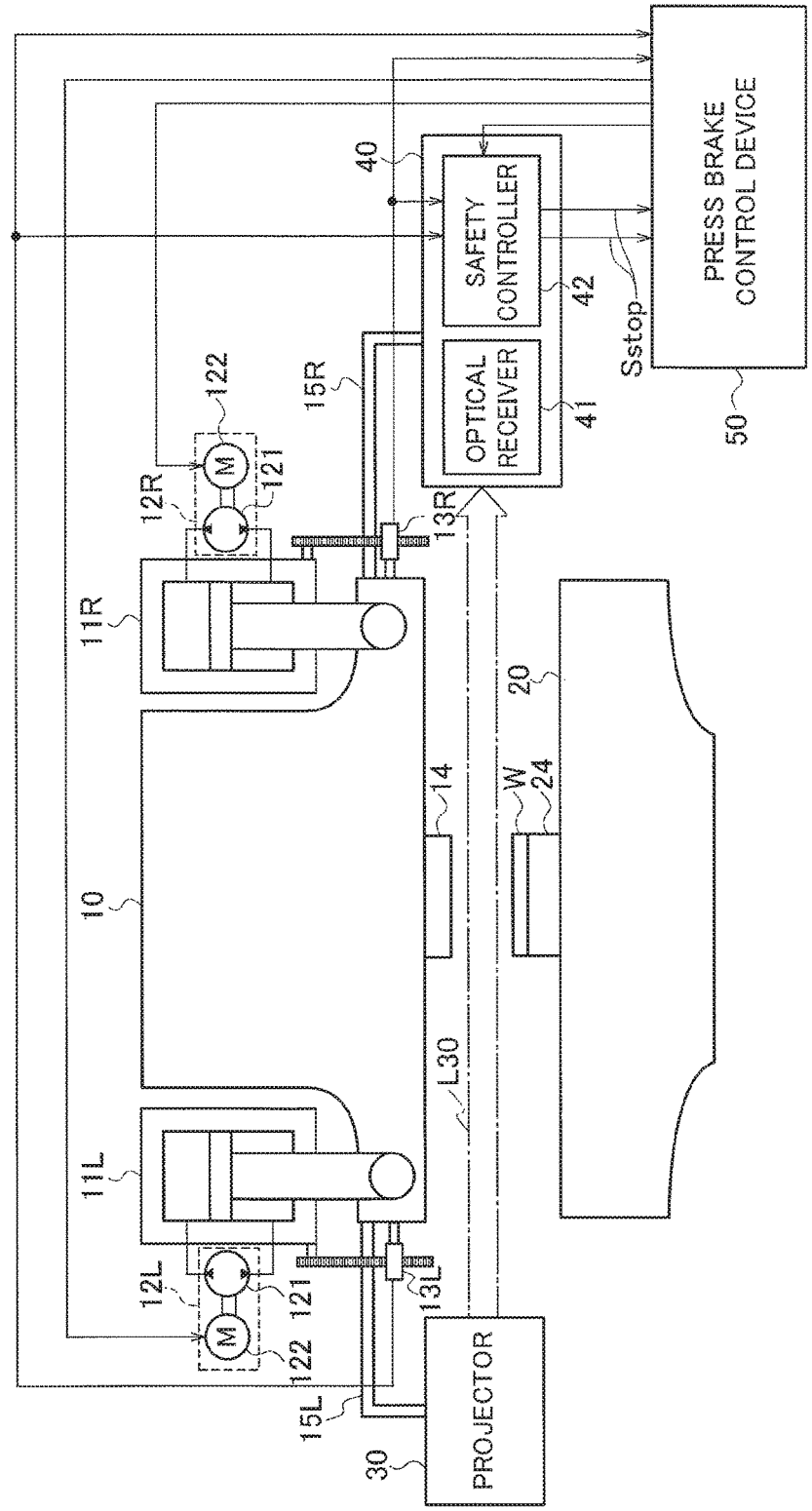
FIG. 1 is a view illustrating a schematic configuration of a safety device of a press brake according to an embodiment.

Hereinafter, a safety device of a press brake and a controlling method of a press brake according to an embodiment will be described with reference to the accompanying drawings. First, a schematic configuration of the press brake will be described by using FIG. 1. The press brake includes an upper table 10 and a lower table 20. The upper table 10 is configured to move vertically by hydraulic cylinders 11L and 11R provided on the left and right sides.

Actuators 12L and 12R drive the hydraulic cylinders 11L and 11R, respectively. For example, the actuators 12L and 12R are configured by a two-way rotational pump 121 and a motor 122 which rotates the two-way rotational pump 121 forward or reverse.

When a press brake control device 50 controls the motor 122 so as to rotate the motor 122 forward, the two-way rotational pump 121 can be rotated forward to lower the hydraulic cylinders 11L and 11R. When the press brake control device 50 controls the motor 122 so as to rotate the motor 122 reversely, the two-way rotational pump 121 can be rotated reversely to raise the hydraulic cylinders 11L and 11R. The press brake control device 50 can be configured by a NC device.

Linear encoders 13L and 13R detect the vertical position of the upper table 10. The positional information which the linear encoders 13L and 13R detect is supplied to the press brake control device 50 and a safety controller 42 to be described later. The press brake control device 50 controls the vertical position of the upper table 10 based on the positional information.

The upper table 10 is attached with an unillustrated upper tool holder, and the lower table 20 is attached with an unillustrated lower tool holder. The upper tool holder is mounted with a punch 14, and the lower tool holder is mounted with a die 24. In this way, the upper table 10 holds the punch 14, and the lower table 20 holds the die 24. A material W which is a plate-shaped plate material, for example, is disposed on the die 24. When the upper table 10 is lowered, the material W is bent in the state of being sandwiched between the punch 14 and the die 24.

Next, the schematic configuration of the safety device of the press brake according to an embodiment will be described. In FIG. 1, a projector 30 is mounted through an arm 15L on the left side of the upper table 10. A light receiving unit 40 including an optical receiver 41 and the safety controller 42 is mounted through an arm 15R on the right side of the upper table 10. The safety controller 42 may be provided outside the light receiving unit 40.

The projector 30 emits laser light L30 toward the optical receiver 41 in such a way that the laser light L30 passes through between the punch 14 and the die 24, and the optical receiver 41 receives the laser light L30. When the upper table 10 is lowered, the optical receiver 41 receives the laser light L30 until the laser light L30 is obstructed by the material W.

The safety controller 42 generates and outputs a stop signal Sstop which decides whether to stop lowering of the upper table 10 depending on whether the optical receiver 41 is in a light receiving state of receiving the laser light L30 or in a light obstructing state of not receiving the laser light L30. In the stop signal Sstop, the value of "0" means that the lowering is continued without stopping the lowering of the upper table 10, and the value of "1" means that the lowering of the upper table 10 is stopped.

When the optical receiver 41 receives the laser light L30, the laser light L30 is not obstructed by an intrusion object such as a hand. In this state, the safety controller 42 outputs the value "0" as the stop signal Sstop. When the laser light L30 is obstructed by an intrusion object such as a hand while the upper table 10 is lowered, the optical receiver 41 does not receive the laser light L30. In this state, the safety controller 42 outputs the value "1" as the stop signal Sstop.

As will be described later, the safety controller 42 is configured not to output the value "1" as the stop signal Sstop in a case where the laser light L30 is obstructed by the material W (or the die 24), and the optical receiver 41 does not receive the laser light L30.

When the safety controller 42 outputs the value "1" as the stop signal Sstop, the press brake control device 50 stops the lowering of the upper table 10 and suspends the bending processing of the material by the press brake.

Figure 2:
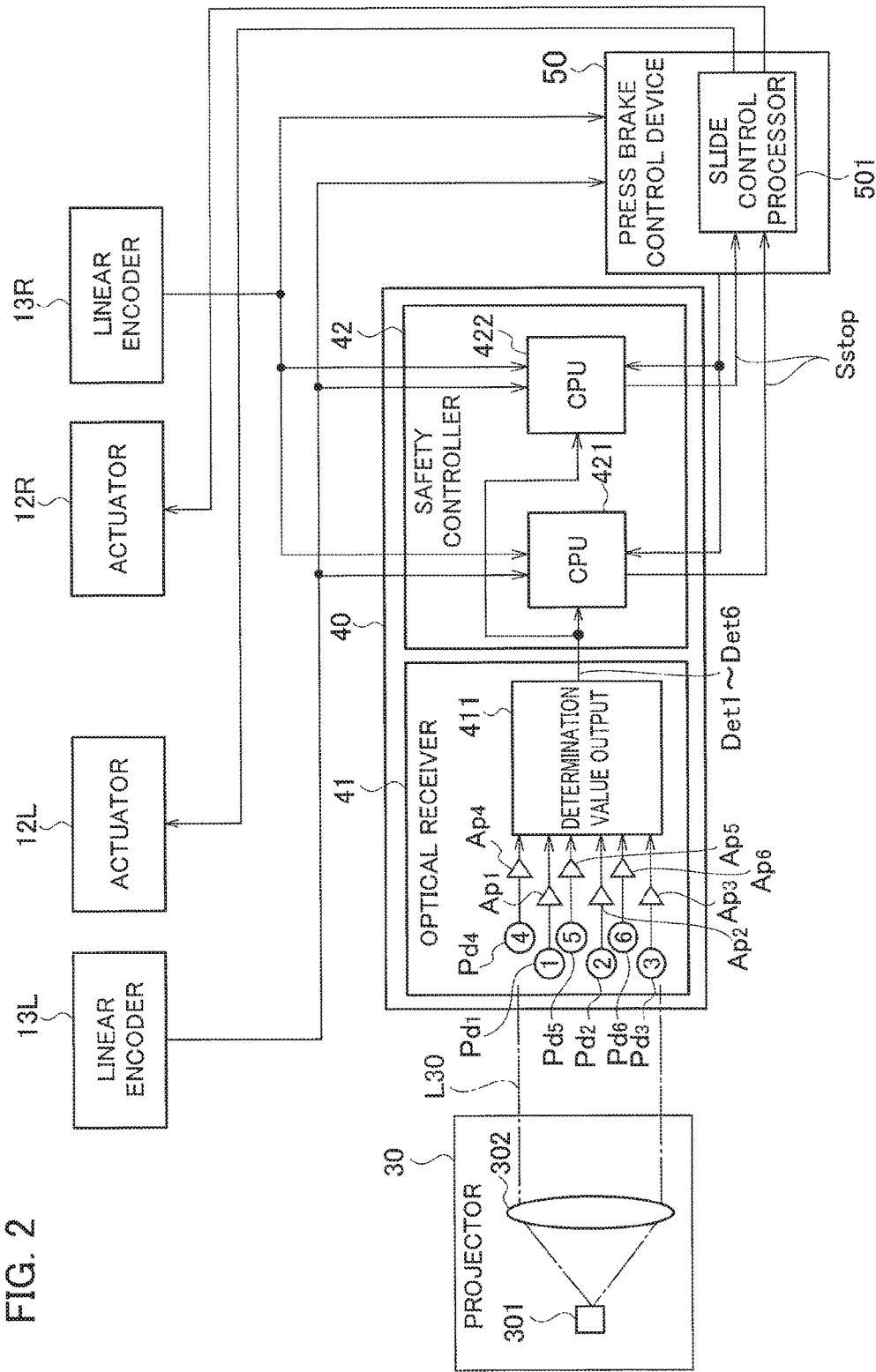
FIG. 2 is a block diagram illustrating a specific configuration of the safety device of the press brake according to an embodiment.

By using FIGS. 2 and 3, the specific configuration of the safety device of the press brake will be described. As illustrated in FIG. 2, the projector 30 includes a laser light source 301, and a collimating lens 302 which converts divergent light of laser light emitted from the laser light source 301 into parallel light of the laser light L30.

The optical receiver 41 includes six photodiodes Pd1 to Pd6, for example. For convenience, the photodiodes Pd1 to Pd6 are denoted by the reference numerals 1 to 6, respectively. The photodiode is an example of a photodetector. The photodiodes Pd1 to Pd6 individually detect the light receiving state and the light obstructing state of the laser light L30.

The optical receiver 41 includes amplifiers Ap1 to Ap6 which amplify the respective output signals of the photodiodes Pd1 to Pd6, and a determination value output unit 411 which outputs a determination value indicating whether or not the laser light L30 is obstructed based on the current values output by the amplifiers Ap1 to Ap6. The determination value output unit 411 may be configured by a circuit or may be configured by a processor.

Figure 3:
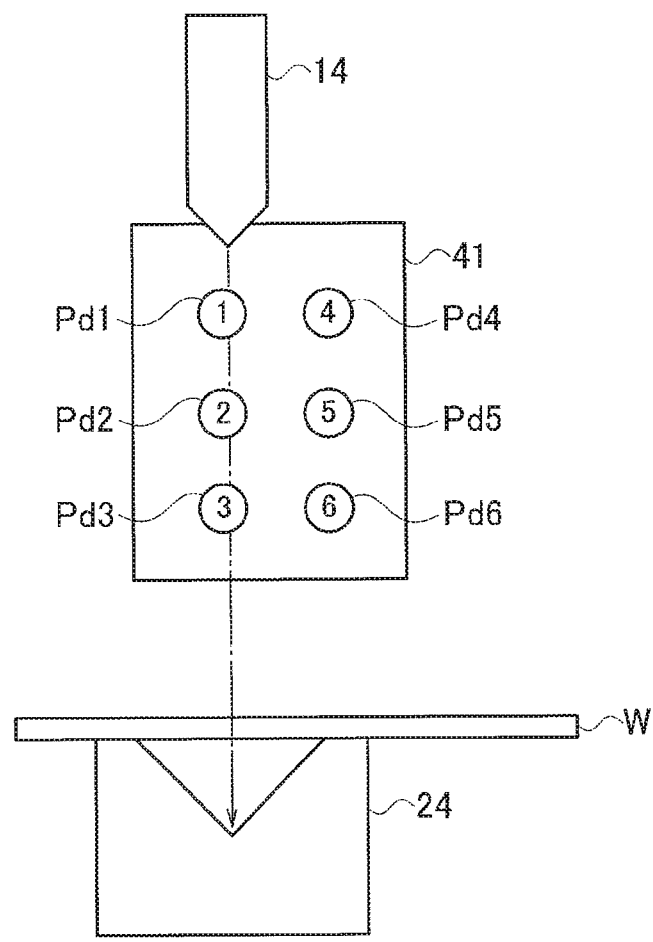
FIG. 3 is a schematic plan view illustrating a disposed state of photodiodes when viewing an optical receiver from a projector.

FIG. 3 illustrates the disposed state of the photodiodes Pd1 to Pd6 when viewing the optical receiver 41 from the projector 30. In FIG. 3, the right side corresponds to the front side of the press brake, and the left side corresponds to the back side of the press brake.

The photodiodes Pd1 to Pd3 are arranged in the vertical direction along the movement path of the punch 14 when the punch 14 lowered in the direction of the die 24. The photodiodes Pd1 to Pd3 are arranged on the movement path or slightly on the back side of the movement path. The photodiodes Pd4 to Pd6 are arranged in the vertical direction on the front side of the movement path. The photodiodes Pd1 and Pd4, Pd2 and Pd5, and Pd3 and Pd6 are arranged in the same vertical position.

The number of the photodiode arranged along the movement path of the punch 14 and the photodiode arranged on the front side of the movement path is not limited to three, and may be two, four, or more. The number of the photodiode for receiving the laser light L30 is not limited. An intrusion object is detected more easily as the number of the photodiode increases.

As one example, in a case where the amplifiers Ap1 to Ap6 receive the laser light L30, and the amplifiers Ap1 to Ap6 output the current value having a predetermined level or more, the determination value output unit 411 outputs the determination value "0" indicating that the laser light L30 is not obstructed. In a case where any one of the amplifiers Ap1 to Ap6 does not receive the laser light L30, and the corresponding amplifier among the amplifiers Ap1 to Ap6 does not output the current value having the predetermined level or more, the determination value output unit 411 outputs the determination value "1" indicating that the laser light L30 is obstructed.

The safety controller 42 includes two central processing units (CPU) 421 and 422. The determination value output by the determination value output unit 411 is supplied to the CPUs 421 and 422. In FIG. 2, the signal line from the determination value output unit 411 to the CPUs 421 and 422 is illustrated as one line. However, determination values Det1 to Det6 based on the respective output signals of the photodiodes Pd1 to Pd6 are supplied in parallel to the CPUs 421 and 422.

The stroke of the press brake which is the positional information detected by the linear encoders 13L and 13R is supplied to the CPUs 421 and 422. The stroke of the press brake is one of parameters. In addition, the various parameters of the press brake (including the safety device) are supplied by the press brake control device 50 to the CPUs 421 and 422. The parameters which are supplied by the press brake control device 50 to the CPUs 421 and 422 includes the information on the punch 14 and the die 24, the information on the material W, and the information on the attachment positions of the photodiodes Pd1 to Pd6.

In a case where the linear encoders 13L and 13R does not supply the stroke of the press brake to the CPUs 421 and 422, the press brake control device 50 may instead supply the stroke of the press brake to the CPUs 421 and 422.

The CPUs 421 and 422 detect whether or not an intrusion object such as a hand enters the area where the punch 14 is lowered based on the input parameters and the determination value output by the determination value output unit 411.

The safety controller 42 includes the two CPUs 421 and 422 so that the lowering of the upper table 10 is reliably stopped when an intrusion object such as a hand enters the area where the punch 14 is lowered. Accordingly, even if one CPU is broken, the safety operation can be performed. The safety controller 42 may be configured by one CPU and may be configured by three or more CPUs.

Here, the safety controller 42 is configured by CPUs, and detects the presence/absence of an intrusion object by software. However, the safety controller 42 may be configured by a circuit by hardware to detect the presence/absence of an intrusion object.

The press brake control device 50 includes a slide control processor 501. The target stroke at the time of bending the material W is provided to the slide control processor 501. The slide control processor 501 controls the actuators 12L and 12R to lower the upper table 10 by an amount of the target stroke. When the CPU 421 or 422 supplies the value "1" as the stop signal Sstop to the slide control processor 501, the slide control processor 501 controls the actuators 12L and 12R to stop the lowering of the upper table 10.

Figure 4:
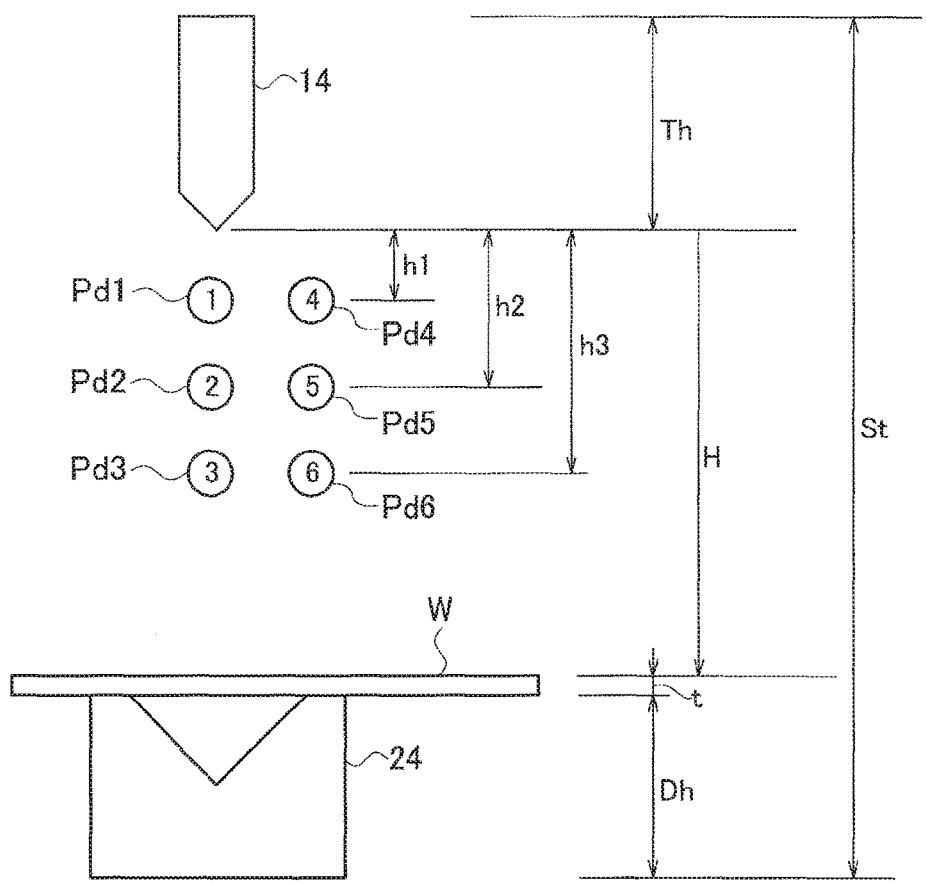
FIG. 4 is a view illustrating parameters which are used to determine whether a safety controller performs a safety operation at the time of normal bending of bending a material which does not have a flange.
Figure 5:
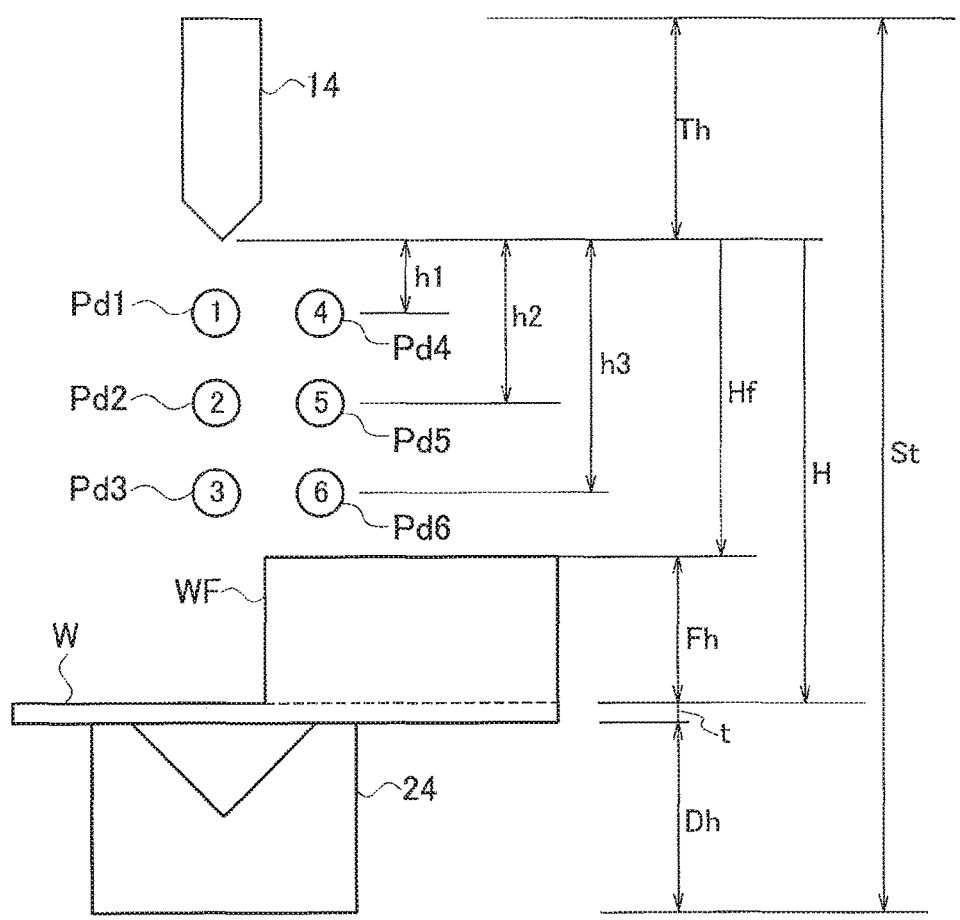
FIG. 5 is a view illustrating parameters which are used to determine whether the safety controller performs the safety operation at the time of box bending of bending a material which has a flange.
Figure 6:
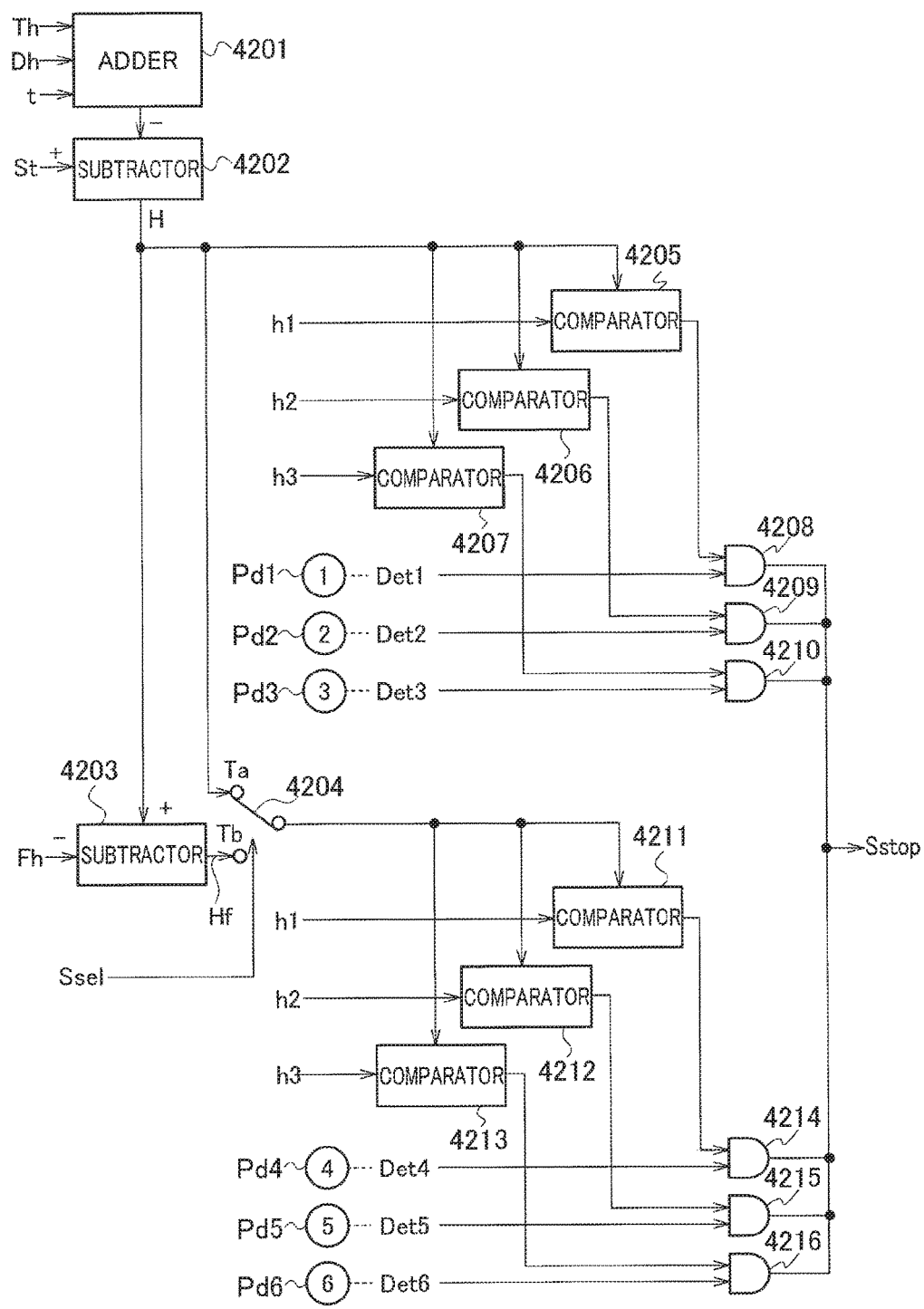
FIG. 6 is a block diagram illustrating an example of a functional inner configuration of the safety controller.

The specific operation of the safety device of the press brake according to an embodiment, and the controlling method of the press brake according to an embodiment are described by using FIGS. 4 to 6. FIG. 4 illustrates a case where the plate-shaped material W is subject to the bending processing, and FIG. 5 illustrates a case where the material W which has a flange WF standing toward the upper side (punch 14 side) on the side of the plate-shaped plate material is subject to the bending processing. The bending processing illustrated in FIG. 4 is referred to as a normal bending, and the bending processing illustrated in FIG. 5 is referred to a box bending.

When a processing program is started which performs a bending processing on the material W, the stroke St which is a distance from the lower end of the upper table 10 to the upper end of the lower table 20, as illustrated in FIG. 4 or 5, is supplied to the safety controller 42 (CPUs 421 and 422). The stroke St is a value which varies according to the lowering or the raising of the upper table 10. The safety controller 42 can obtain the stroke St based on the positional information of the upper table 10 which is detected by the linear encoders 13L and 13R.

The press brake control device 50 supplies the parameters other than the stroke St illustrated in FIG. 4 or 5 to the safety controller 42, when the processing program is started. The parameters which the press brake control device 50 supplies to the safety controller 42 are described in detail as follows.

The press brake control device 50 supplies the information which indicates a height Th of the punch 14, a height Dh of the die 24, and the distances h1 to h3 from the tip (the end part on the die 24 side) of the punch 14 to the photodiodes Pd1 and Pd4, Pd2 and Pd5, and Pd3 and Pd6 to the safety controller 42. The distances h1 to h3 are fixed values set in advance. The press brake control device 50 supplies a plate thickness t and a value indicating a flange height Fh in a case where the material W is formed with the flange WF to the safety controller 42.

FIG. 6 illustrates an example of a functional inner configuration of the CPUs 421 and 422. In FIG. 6, an adder 4201 calculates the value indicating (Th+Dh+t) by adding the values of the height Th of the punch 14, the height Dh of the die 24, and the plate thickness t. The subtractor 4202 calculates the distance H from the tip of the punch 14 to the upper end of the material W by subtracting the value indicating (Th+Dh+t) from the stroke St. The distance H in FIG. 4 is a distance from the tip of the punch 14 to the upper surface of the material W. The distance H in FIG. 5 is a distance from the tip of the punch 14 to the upper surface of the plate portion of the material W.

At the time of the box bending illustrated in FIG. 5, the flange height Fh is input to the subtractor 4203. The subtractor 4203 calculates the distance Hf, which is illustrated in FIG. 5, from the tip of the punch 14 to the upper end of the flange WF by subtracting the flange height Fh from the distance H. In the portion where the flange WF is provided, the upper end of the flange WF serves as the upper end of the material W.

The value indicating the distance H is input to a terminal Ta of a switch 4204, and the value indicating the distance Hf is input to a terminal Tb. A selection signal Ssel is supplied by the press brake control device 50 to the switch 4204. The switch 4204 selects the terminal Ta when the selection signal Ssel indicates the normal bending, and selects the terminal Tb when the selection signal Ssel indicates the box bending.

First, the operation of the CPUs 421 and 422 at the time of the normal bending will be described. The value indicating the distance H is input to all comparators 4205 to 4207 and 4211 to 4213. The values indicating the distances h1 to h3 are input to the comparators 4205 and 4211, 4206 and 4212, and 4207 and 4213, respectively.

The comparators 4205 and 4211, 4206 and 4212, and 4207 and 4213 output the value "1" when it is satisfied that H≥h1, H≥h2, and H≥h3 comparing the value indicating the distance H with the values indicating the distances h1 to h3.

A state where H≥h3 is satisfied means that the upper table 10 is not lowered to the position where the positions of the photodiodes Pd3 and Pd6 reach the upper surface of the material W. A state where H≥h2 is satisfied means that the upper table 10 is not lowered to the position where the positions of the photodiodes Pd2 and Pd5 reach the upper surface of the material W. A state where H≥h1 is satisfied means that the upper table 10 is not lowered to the position where the positions of the photodiodes Pd1 and Pd4 reach the upper surface of the material W.

When all the comparators 4205 to 4207 and 4211 to 4213 output the value "1", the value "1" is supplied to AND circuits 4208 to 4210 and 4214 to 4216. The determination values Det1 to Det3 based on the output signals of the photodiodes Pd1 to Pd3 are supplied to the AND circuits 4208 to 4210, respectively. The determination values Det4 to Det6 based on the output signals of the photodiodes Pd4 to Pd6 are supplied to the AND circuit 4214 to 4216, respectively.

If the laser light L30 is not obstructed by an intrusion object, the determination values Det1 to Det6 are the determination value "0". Accordingly, the CPUs 421 and 422 output, as the stop signal Sstop which is the output of the AND circuits 4208 to 4210 and 4214 to 4216, the value "0" representing not to stop the lowering of the upper table 10.

In a state where the photodiodes Pd1 to Pd6 is not lowered to the position of reaching the upper surface of the material W, and all the comparators 4205 to 4207 and 4211 to 4213 output the value "1", the laser light L30 is obstructed by an intrusion object, and any one of the determination values Det1 to Det6 becomes the determination value "1".

Thus, among the AND circuits 4208 to 4210 and 4214 to 4216, the AND circuit which supplies the determination values Det1 to Det6 which are the determination value "1" outputs the value "1". Accordingly, as the stop signal Sstop, the CPUs 421 and 422 output the value "1" representing to stop the lowering of the upper table 10.

The comparators 4205 and 4211, 4206 and 4212, and 4207 and 4213 output the value "0" when it is satisfied that H<h1, H<h2, and H<h3 comparing the value indicating the distance H with the values indicating the distances h1 to h3. First, when the upper table 10 is lowered, the positions of the photodiodes Pd3 and Pd6 reach the upper surface of the material W, and the comparators 4207 and 4213 output the value "0".

At that time, the laser light L30 is obstructed by the material W, and the photodiodes Pd3 and Pd6 cannot receive the laser light L30. Thus, the determination values Det3 and Det6 become the determination value "1". Since the value "0" is supplied by the comparators 4207 and 4213 to the AND circuits 4210 and 4216, the output of the AND circuits 4210 and 4216 is the value "0".

Accordingly, as the stop signal Sstop, the CPUs 421 and 422 do not output the value "1" representing to stop the lowering of the upper table 10, and output the value "0" representing not to stop the lowering of the upper table 10, so as to continue to lower the upper table 10.

Next, when the upper table 10 is lowered further, the positions of the photodiodes Pd2 and Pd5 reach the upper surface of the material W, and the comparators 4206 and 4212 output the value "0". At that time, the laser light L30 is obstructed by the material W, and the photodiodes Pd2 and Pd5 cannot receive the laser light L30. Thus, the determination values Det2 and Det5 become the determination value "1".

The value "0" is supplied by the comparators 4206 and 4212 to the AND circuits 4209 and 4215. Thus, the output of the AND circuits 4209 and 4215 becomes the value "0". Accordingly, as the stop signal Sstop, the CPUs 421 and 422 output the value "0" representing not to stop the lowering of the upper table 10, so as to continue to lower the upper table 10.

Finally, when the upper table 10 is lowered further, the positions of the photodiodes Pd1 and Pd4 reach the upper surface of the material W, and the comparators 4205 and 4211 output the value "0". At that time, the laser light L30 is obstructed by the material W, and the photodiodes Pd1 and Pd4 cannot receive the laser light L30. Thus, the determination values Det1 and Det4 become the determination value "1".

The value "0" is supplied by the comparators 4205 and 4211 to the AND circuits 4208 and 4214. Thus, the output of the AND circuits 4208 and 4214 becomes the value "0". Accordingly, as the stop signal Sstop, the CPUs 421 and 422 output the value "0" representing not to stop the lowering of the upper table 10, so as to continue to lower the upper table 10.

In this way, even in a case where the upper table 10 is lowered and the laser light L30 is obstructed by the material W such that the photodiodes Pd1 to Pd6 change to the light obstructing state of not receiving the laser light L30, the bending processing of the material W can be continued without stopping the lowering of the upper table 10.

Until the bending processing of the material W is completed after the processing program starts, the optical receiver 41 is constantly operated regardless of the position of the upper table 10 and outputs the determination values Det1 to Det6. Accordingly, the safety controller 42 is constantly operated without a period in which the safety controller 42 is invalidated. Thus, the safety can be improved.

After the bending processing of the material W is completed, the press brake control device 50 (slide control processor 501) raises the upper table 10. It is not necessary to perform the above-described safety operation when the upper table 10 is raised. In the safety controller 42, the stop signal Sstop may be forced to the value "0" when the stroke St increases.

Next, the operation of the CPUs 421 and 422 in the case of the box bending illustrated in FIG. 5, the difference will be mainly described from the operation at the time of the normal bending. The value indicating the distance H is input to the comparators 4205 to 4207. At the time of the box bending, the terminal Tb is selected by the selection signal Ssel. Thus, the value indicating the distance Hf from the tip of the punch 14 to the upper end of the flange WF is input to the comparators 4211 to 4213.

First, when the upper table 10 is lowered, the position of the photodiode Pd6 reaches the upper end of the flange WF, and the comparator 4213 outputs the value "0". At this time, the laser light L30 is obstructed by the flange WF, and the photodiode Pd6 cannot receive the laser light L30. Thus, the determination value Det6 becomes the determination value "1".

The value "0" is supplied by the comparator 4213 to the AND circuit 4216. Thus, the output of the AND circuit 4216 becomes the value "0". Accordingly, as the stop signal Sstop, the CPUs 421 and 422 output the value "0" representing not to stop the lowering of the upper table 10, so as to continue to lower the upper table 10.

Next, when the upper table 10 is lowered further, the position of the photodiode Pd5 reaches the upper end of the flange WF, and the comparator 4212 outputs the value "0". At this time, the laser light L30 is obstructed by the flange WF, and the photodiode Pd5 cannot receive the laser light L30. Thus, the determination value Det5 becomes the determination value "1".

The value "0" is supplied by the comparator 4212 to the AND circuit 4215. Thus, the output of the AND circuit 4215 becomes the value "0". Accordingly, as the stop signal Sstop, the CPUs 421 and 422 output the value "0" representing not to stop the lowering of the upper table 10, so as to continue to lower the upper table 10.

Finally, when the upper table 10 is lowered further, the position of the photodiode Pd4 reaches the upper end of the flange WF, and the comparator 4211 outputs the value "0". At this time, the laser light L30 is obstructed by the flange WF, and the photodiode Pd4 cannot receive the laser light L30. Thus, the determination value Det4 becomes the determination value "1".

The value "0" is supplied by the comparator 4211 to the AND circuit 4214. Thus, the output of the AND circuit 4214 becomes the value "0". Accordingly, as the stop signal Sstop, the CPUs 421 and 422 output the value "0" representing not to stop the lowering of the upper table 10, so as to continue to lower the upper table 10.

In this way, in the case of the box bending in which the material W has the flange WF, the value indicating the distance Hf is input to the comparators 4211 to 4213 instead of the value indicating the distance H.

Accordingly, even in a case where the laser light L30 is obstructed by the flange W, and the photodiodes Pd4 to Pd6 change to the state of not receiving the laser light L30, the bending processing of the material W can be continued without stopping the lowering of the upper table 10.

Figures 7, 8:
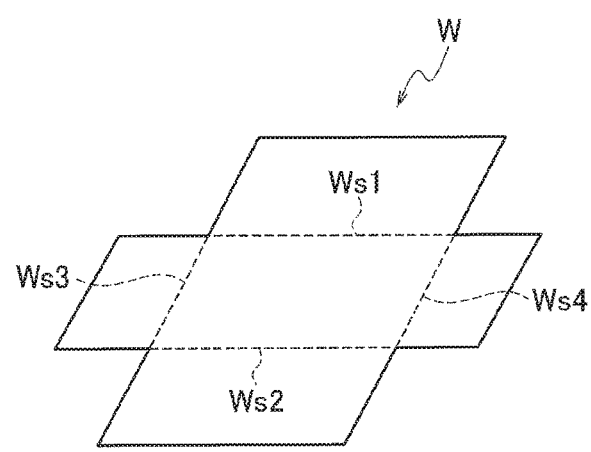
FIG. 7 is a diagram in which a stop condition that allows an operation of a bending processing to stop at the time of the normal bending and the box bending and a non-stop condition that allows the operation not to stop are collected in table form.
FIG. 8 is a perspective view illustrating an example of the material bent by the press brake.

A stop condition that allows the operation of the bending processing to stop at the time of the above-described normal bending and box bending and a non-stop condition that allows the operation not to stop are collected in table form as illustrated in FIG. 7. In FIG. 7, "i" of hi means 1, 2, or 3.

As illustrated in FIG. 7, at the time of the normal bending, the stop condition is that H≥hi is satisfied in the photodiodes Pd1 to Pd3 and Pd4 to Pd6. The safety controller 42 decides whether to stop the lowering of the upper table 10 depending on whether the determination values Det1 to Det6 are the determination value "0" or the determination value "1".

Moreover, the non-stop condition is that H<hi is satisfied in the photodiodes Pd1 to Pd3 and Pd4 to Pd6. Even when any one of the determination values Det1 to Det6 becomes the determination value "1", the safety controller 42 does not stop the lowering of the upper table 10.

As illustrated in FIG. 7, at the time of the box bending, the stop condition is that H≥hi is satisfied in the photodiodes Pd1 to Pd3, and Hf hi is satisfied in the photodiodes Pd4 to Pd6. The safety controller 42 decides whether to stop the lowering of the upper table 10 depending on whether the determination values Det1 to Det6 are the determination value "0" or the determination value "1".

Moreover, the non-stop condition is that H<hi is satisfied in the photodiodes Pd1 to Pd3 and Hf<hi is satisfied in the photodiodes Pd4 to Pd6. Even when any one of the determination values Det1 to Det6 becomes the determination value "1", the safety controller 42 does not stop the lowering of the upper table 10.

In accordance with the safety device of the press brake and the controlling method of the press brake according to an embodiment, regardless of whether the material W has the flange WF, in a case where the laser light is obstructed by an intrusion object, the operation of the bending processing can be stopped, and in a case where the laser light is obstructed by the material W, the operation of the bending processing can be continued.

Figure 9:
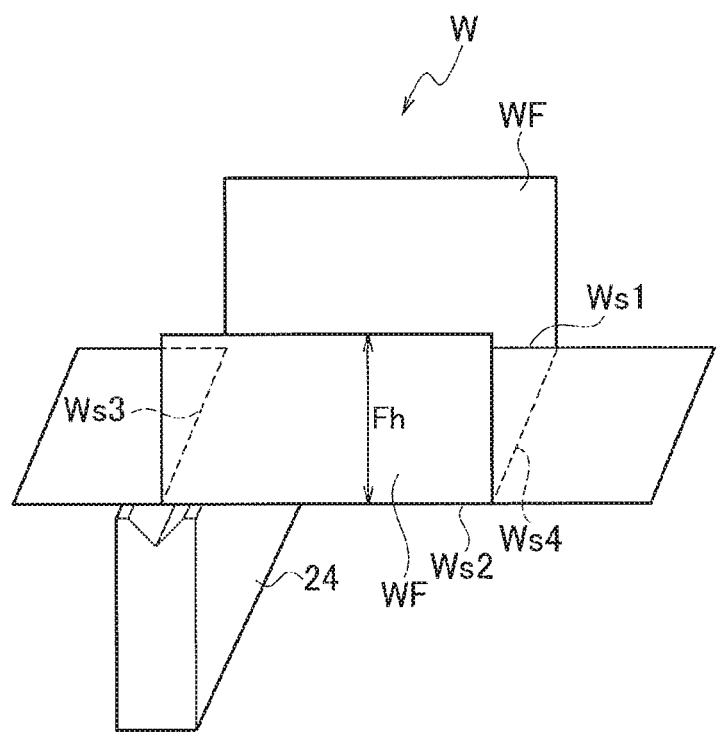
FIG. 9 is a perspective view illustrating a state in which the material illustrated in FIG. 8 is being subject to the bending processing.

Here, by exemplifying a case where the material W illustrated in FIG. 8 is subject to the bending processing, a method of performing the bending processing on the material W by the press brake will be described. The material W is subject to the bending processing of bending sides Ws1 to Ws4 illustrated by a broken line in the order of the sides Ws1 to Ws4. In this case, when the sides Ws1 and Ws2 are subject to the bending processing, the normal bending is performed. As illustrated in FIG. 9, when the side Ws3 is subject to the bending processing, the box bending is performed. Also when the side Ws4 is subject to the bending processing, the box bending is performed.

As illustrated in FIG. 10, in step S1, the press brake control device 50 receives the processing data indicating the method of the processing of the material W by a server or a computer. The shape data of the material W is included in the processing data. In step S2, the press brake control device 50 automatically determines a processing order based on the processing data. An operator may set the processing order manually.

In step S3, the press brake control device 50 determines whether the bending processing of each of the sides Ws1 to Ws4 is the normal bending or the box bending. When the bending processing is the box bending, in step S3, the press brake control device 50 automatically calculates the height Fh of the flange WF. The operator may set the height Fh of the flange WF manually. The press brake control device 50 can set the selection signal Ssel indicating the normal bending and the selection signal Ssel indicating the box bending with respect to the bending processing of each of the sides Ws1 to Ws4.

In step S4, the press brake control device 50 transmits various parameters including the height Fh of the flange WF to the safety controller 42. In step S5, when the operator operates a processing start such as depressing a foot switch, the press brake control device 50 starts the bending processing. In a case where a plurality of bending processings are performed on the sides Ws1 to Ws4, the bending processing described herein is the first bending processing.

In step S6, the press brake control device 50 determines whether the value "1" is input as the stop signal Sstop by the safety controller 42. In step S7, if the value "1" is input (NO), the press brake control device 50 determines whether the processing is completed. If the processing is not completed (NO), the press brake control device 50 repeats the processes of steps S6 and S7.

If the processing is completed (YES), the press brake control device 50 raises the upper table 10. In step S8, it is determined whether there is a next bending processing. If there is a next bending processing (YES), the operator arranges the material W for the next bending processing on the punch 14. In step S5, further, the bending processing starts in response to the operation of the processing start by the operator. Hereinafter, the processes of steps S5 to S8 are repeated until all of the bending processings are completed. If there is not a next bending processing in step S8 (NO), all of the bending processings are completed, and the press brake control device 50 ends the process.

At the time of the above bending processing, if the value "1" is input in step S6 (YES), the state means that an intrusion object such as a hand enters the area where the punch 14 is lowered. Therefore, in step S9, the press brake control device 50 stops the lowering of the upper table 10 to suspend the bending processing, and ends the process of the bending processing.

Instead of suspending the bending processing to end the process, in step S9, in a case where an instruction to resume the bending processing is given after the bending processing is stopped temporarily, the press brake control device 50 may resume the bending processing from the stopped state to be continued. In this case, the press brake control device 50 may shift a procedure to step S7 after step S9.

As described above, in accordance with the safety device of the press brake and the controlling method of the press brake according to an embodiment, the area where the safety device is invalidated is not set above the material W. Thus, the safety can be improved. According to the safety device of the press brake and the controlling method of the press brake according to an embodiment, regardless of whether the material W includes a flange, in a case where an intrusion object such as a hand obstructs the laser light, the operation of the bending processing can be stopped, and in a case where the material W obstructs the laser light, the operation of the bending processing can be stopped.

The invention is not limited to an embodiment described above, and various modifications can be made without departing from the scope of the invention.

INDUSTRIAL APPLICABILITY

The present invention can be used to improve the safety of the press brake.

The invention claimed is:

1. A safety device of a press brake which includes an upper table for holding a punch, a lower table for holding a die, and an actuator which lowers and raises the upper table, the safety device comprising:
   a projector which is mounted on the upper table, and configured to emit laser light in such a way that the laser light passes through between the punch and the die;
   an optical receiver which is mounted on the upper table, comprising a photodetector which detects the laser light passing through between the punch and the die, and configured to determine whether the optical receiver is in a light receiving state of receiving the laser light, or in a light obstructing state of not receiving the laser light; and
   a safety controller configured, when the actuator lowers the upper table for performing a bending processing by sandwiching a material arranged on the die between the punch and the die, to control lowering of the upper table to stop, when it is determined that the optical receiver is in the light obstructing state in a period in which a condition is satisfied that a first distance between a tip on the die side of the punch and an upper end of the punch side of the material is equal to or greater than a second distance between the tip of the punch and the photodetector, and to control the lowering to continue without stopping the lowering of the upper table even when it is determined that the optical receiver is in the light obstructing state in a period in which a condition is satisfied that the first distance is less than the second distance, wherein
   the safety controller comprises:
   a comparator configured to compare the first distance with the second distance so as to output a first output value when the first distance is equal to or greater than the second distance, and to output a second output value when the first distance is less than the second distance; and
   an AND circuit which receives the first or second output value from the comparator, and a light obstructing output value or a non-light obstructing output value from the optical receiver, and configured to output a lowering stop signal of the upper table, only when the AND circuit receives the first output value from the comparator and the light obstructing output value from the optical receiver.

2. The safety device of the press brake according to claim 1, wherein
   the optical receiver comprises a plurality of first photodetectors which are arranged along a movement path of the punch, and a plurality of second photodetectors which are arranged on a front side of the plurality of first photodetectors, and is configured to determine whether the optical receiver is in the light receiving state or in the light obstructing state, based on whether each photodetector of the plurality of first and second photodetectors individually detects the laser light.

3. The safety device of the press brake according to claim 2, wherein
   when the material has a flange standing toward the punch side on a side of a plate-shaped plate material,
   the safety controller
   calculates the first distance with an upper end of the plate material set as the upper end of the punch side of the material, when the optical receiver determines whether the optical receiver is in the light receiving state or in the light obstructing state based on whether the plurality of first photodetectors detect the laser light, and
   calculates the first distance with an upper end of the flange set as the upper end of the punch side of the material, when the optical receiver determines whether the optical receiver is in the light receiving state or in the light obstructing state based on whether the plurality of second photodetectors detect the laser light.

4. The safety device of the press brake according to claim 3, wherein
   a value indicating a height of the flange calculated based on processing data which indicates a method of a processing of the material is supplied to the safety controller, and
   the safety controller calculates the first distance based on the height of the flange.

* * * * *